(12) United States Patent
Cheng

(10) Patent No.: US 12,354,706 B2
(45) Date of Patent: Jul. 8, 2025

(54) CONTROL APPARATUS, MEMORY, SIGNAL PROCESSING METHOD, AND ELECTRONIC DEVICE

(71) Applicant: CHANGXIN MEMORY TECHNOLOGIES, INC., Hefei (CN)

(72) Inventor: Jingwei Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 175 days.

(21) Appl. No.: 18/154,815

(22) Filed: Jan. 14, 2023

(65) Prior Publication Data

US 2024/0013825 A1 Jan. 11, 2024

Related U.S. Application Data

(63) Continuation of application No. PCT/CN2022/109916, filed on Aug. 3, 2022.

(30) Foreign Application Priority Data

Jul. 8, 2022 (CN) .......................... 202210815505.8

(51) Int. Cl.
*G11C 8/00* (2006.01)
*G11C 7/10* (2006.01)
*G11C 7/22* (2006.01)

(52) U.S. Cl.
CPC .............. *G11C 7/222* (2013.01); *G11C 7/106* (2013.01); *G11C 7/1069* (2013.01)

(58) Field of Classification Search
CPC ...................................... G11C 7/222
USPC ......................................... 365/233.1
See application file for complete search history.

(56) References Cited

U.S. PATENT DOCUMENTS

| 2007/0162713 A1 | 7/2007 | Schnell et al. |
| 2008/0034142 A1* | 2/2008 | Jo .............................. G06F 1/12 |
| | | 710/301 |
| 2010/0054055 A1 | 3/2010 | Choi |
| 2012/0300563 A1 | 11/2012 | Kim |
| 2013/0028029 A1 | 1/2013 | Huang |

(Continued)

FOREIGN PATENT DOCUMENTS

| CN | 1283060 C | 11/2006 |
| CN | 101667450 A | 3/2010 |

(Continued)

OTHER PUBLICATIONS

First Office Action of the Taiwanese application No. 112102736, issued on Sep. 27, 2023, 7 pages with English abstract.

(Continued)

*Primary Examiner* — Hoai V Ho
(74) *Attorney, Agent, or Firm* — Syncoda LLC; Feng Ma

(57) ABSTRACT

A control apparatus includes: a receiving circuit, configured to receive a read clock signal from the memory, and output the read clock signal; a clock circuit, configured to generate a first internal clock signal; a selection circuit, configured to receive the read clock signal and the first internal clock signal, and output one of the read clock signal and the first internal clock signal as a target read clock signal; and a latch circuit, configured to receive the target read clock signal and a read data signal sent by the memory, and perform latch processing on the read data signal by using the target read clock signal.

10 Claims, 13 Drawing Sheets

(56) References Cited

U.S. PATENT DOCUMENTS

| | | |
|---|---|---|
| 2019/0172512 A1 | 6/2019 | Oh et al. |
| 2019/0237127 A1 | 8/2019 | Moon et al. |
| 2020/0005729 A1 | 1/2020 | Mozak et al. |
| 2023/0005515 A1* | 1/2023 | Kim ................. G11C 29/50012 |

FOREIGN PATENT DOCUMENTS

| | | |
|---|---|---|
| CN | 110047552 A | 7/2019 |
| CN | 112005497 A | 11/2020 |
| CN | 107835988 B | 12/2020 |
| KR | 20190093102 A | 8/2019 |
| TW | 200709220 A | 3/2007 |
| TW | 202213949 A | 4/2022 |
| TW | 202223671 A | 6/2022 |

OTHER PUBLICATIONS

International Search Report in the international application No. PCT/CN2022/109916, mailed on Nov. 30, 2022, 5 pages.
KR firs office action in application No. 10-2022-7042780, mailed on Sep. 12, 2024.
Supplementary European Search Report in the European application No. 22838629.8, mailed on Feb. 13, 2024. 9 pages.
European patent office action in application No. 22838629.8, mailed on Oct. 25, 2024.

* cited by examiner

CONTROL APPARATUS, MEMORY, SIGNAL PROCESSING METHOD, AND ELECTRONIC DEVICE

CROSS-REFERENCE TO RELATED APPLICATIONS

This is a continuation of International Application No. PCT/CN2022/109916 filed on Aug. 3, 2022, which claims priority to Chinese Patent Application No. 202210815505.8 filed on Jul. 8, 2022. The disclosures of the above-referenced applications are hereby incorporated by reference in their entirety.

BACKGROUND

In an electronic device, a Central Processing Unit (CPU) sends a read instruction to a memory, then receives a read clock signal and a read data signal returned by the memory, and performs latch processing on the read data signal using the read clock signal, so as to obtain required data. However, in the process of adjusting a duty cycle of the clock signal by the memory, the CPU needs to obtain a duty cycle parameter of the clock signal by reading a corresponding mode register in the memory. However, in this process, the clock signal in the memory may be distorted, and then the read clock signal returned by the memory to a central controller is also distorted, which causes the CPU to obtain wrong data, and eventually causes failure in adjustment of the duty cycle of the clock signal.

SUMMARY

The present disclosure relates to the technical field of semiconductor memories, and in particular to, a control apparatus, a memory, a signal processing method, and an electronic device.

The present disclosure provides a control apparatus, a memory, a signal processing method, and an electronic device, which may not only improve the correctness of data latching, but also save power consumption.

The technical solutions of the present disclosure are implemented as follows.

In a first aspect, the embodiments of the present disclosure provide a control apparatus. The control apparatus is connected with a memory. The control apparatus may include: a receiving circuit, a clock circuit, a selection circuit, and a latch circuit.

The receiving circuit may be configured to receive a read clock signal from the memory, and output the read clock signal.

The clock circuit may be configured to generate a first internal clock signal.

The selection circuit may be configured to receive the read clock signal and the first internal clock signal, and output one of the read clock signal and the first internal clock signal as a target read clock signal.

The latch circuit may be configured to receive the target read clock signal and a read data signal sent by the memory, and perform latch processing on the read data signal by using the target read clock signal.

In a second aspect, the embodiments of the present disclosure provide a memory. The memory may include a clock processing circuit. The memory is connected with a control apparatus.

The memory may be configured to, in a case where a first read instruction is received, determine a read data signal based on the first read instruction, determine a read clock signal through the clock processing circuit, and send the read data signal and the read clock signal together to the control apparatus; or, in a case where a second read instruction is received, determine the read data signal based on the second read instruction, and send the read data signal to the control apparatus.

In a third aspect, the embodiments of the present disclosure provide a signal processing method, which is applied to a control apparatus connected with a memory, and may include the following operations.

A read clock signal and a read data signal sent by the memory are received, and a first internal clock signal generated by the control apparatus is determined.

One of the read clock signal and the first internal clock signal is determined as a target read clock signal.

Latch processing is performed on the read data signal by using the target read clock signal.

DETAILED DESCRIPTION

Figure 1:
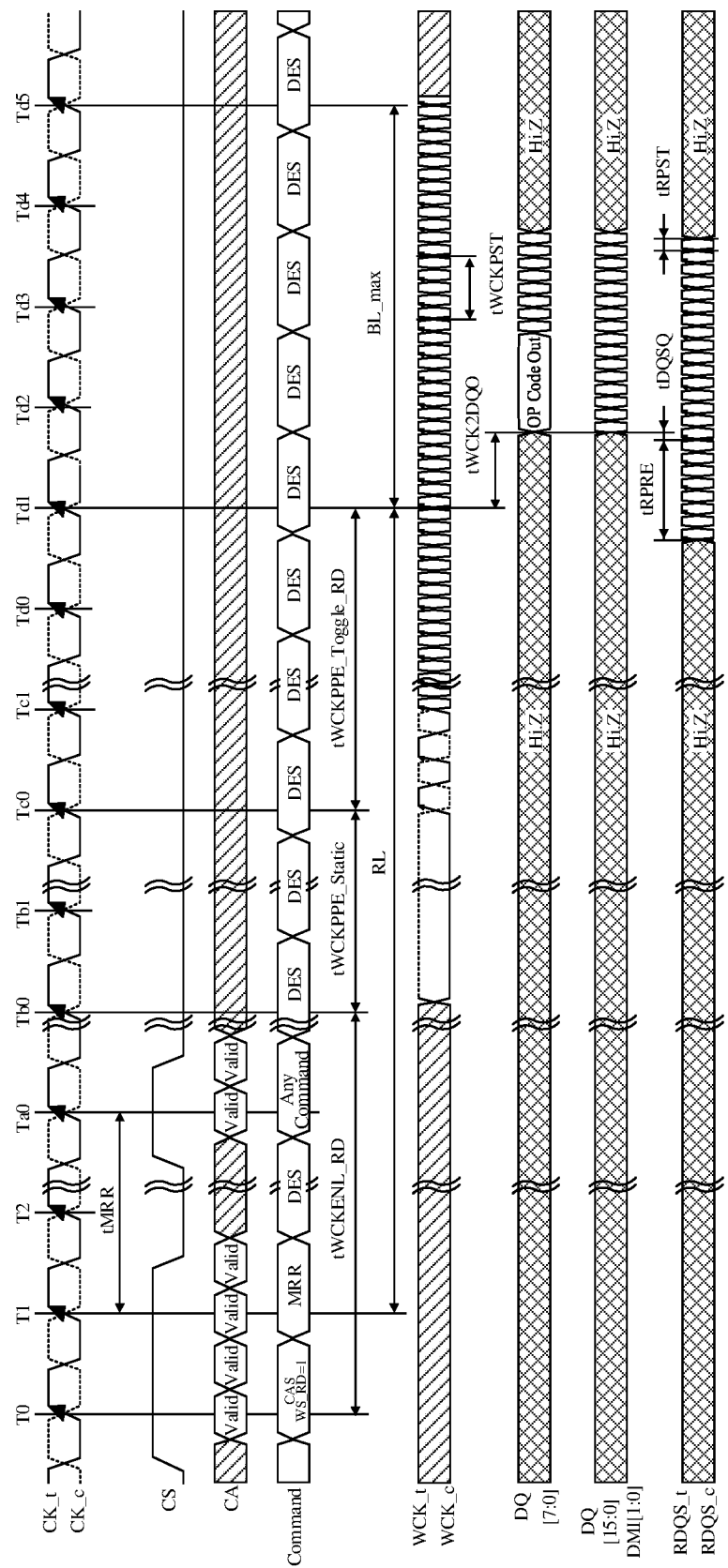
FIG. 1 is a schematic diagram of an operation timing of a Mode Register Read (MRR).

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are shown in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first/second/third" involved in the embodiments of the present disclosure are only used to distinguish similar objects, and do not represent a specific order of the objects. It should be understood that the specific order or sequence of "first/second/third" may be interchangeable under the allowable circumstances, so that the embodiments of the disclosure described herein may be implemented in an order other than those illustrated or described herein.

Dynamic Random Access Memory (DRAM)
Synchronous Dynamic Random Access Memory (SDRAM)
Mode Register Read (MRR)
Million bits per second (Mbps)
N-Metal-Oxide-Semiconductor (NMOS) transistor
P-Metal-Oxide-Semiconductor (PMOS) transistor In a memory (such as a DRAM), the MRR and a normal read instruction use exactly the same operation timing. Referring to FIG. 1, which shows a schematic diagram of an operation timing of MRR. In FIG. 1, T0, T1, etc. are configured to identify different clock cycles, CK_c and CK_t are a pair of differential clock signals, CS is a chip select signal, CA is a command address signal, COMMAND indicates an operating instruction, DQ[7:0] is a data signal of a 8-bit memory, DQ[15:0] is a data signal of a 16-bit memory, and a data clock signal WCK is an external write clock signal sent by a host of an electronic device to the memory, which may be represented as a single signal or a pair of differential clock signals WCK_c and WCK_t at different circuit positions. A read clock signal RDQS is a clock signal output by the memory to the electronic device, and may be represented as a single signal or a pair of differential clock signals RDQS_c and RDQS_t at different circuit positions. Specifically, after the memory receives the MRR sent by a CPU, a data signal DQ (also referred to as a read data signal) is generated, and a read clock signal is generated using the data clock signal received from outside. During the execution of a data read instruction, the memory returns the read data signal DQ and the read clock signal RDQS to the CPU together, and then the CPU latches the read data signal DQ using the read clock signal RDQS, thereby obtaining the required data. In addition, FIG. 1 is a standard timing specified by the Joint Electron Device Engineering Council (JEDEC) standard, in which the meaning of each signal, the principle of related changes, and some unmentioned abbreviated terms may be understood by referring to the industry standard document of the JEDEC, are irrelevant to the technical solutions of the embodiments of the present disclosure, and may not affect the understanding of the embodiments of the present disclosure by the technical personnel. Therefore, no explanation is given.

Figure 2:
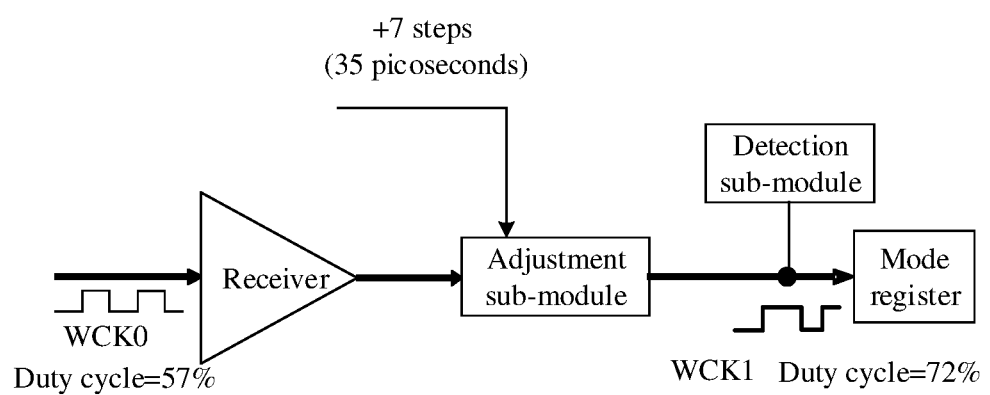
FIG. 2 is a schematic structural diagram of a clock processing circuit.
Figure 3:
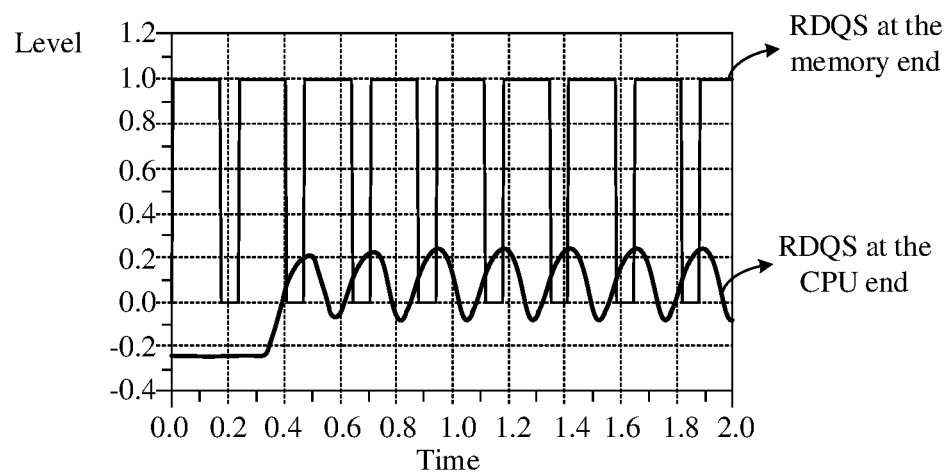
FIG. 3 is a schematic diagram of a waveform of a read clock signal.

A clock processing circuit is arranged in the memory and configured to adjust a duty cycle of a data clock signal WCK0 (including a pair of complementary signals WCK_c/WCK_t), so that the duty cycle of the data clock signal WCK0 meets the requirements. Referring to FIG. 2, which shows a schematic structural diagram of a clock processing circuit. As shown in FIG. 2, in the clock processing circuit, a receiver is configured to receive the data clock signal WCK0 from the outside, an adjustment sub-circuit adjusts the duty cycle of the data clock signal WCK to obtain a second internal clock signal WCK1, and a detection sub-circuit is configured to detect a duty cycle parameter of the second internal clock signal WCK1 and store the duty cycle parameter in a mode register. At the same time, in the process of adjusting the duty cycle of the memory, the CPU sends the MRR to read the duty cycle parameter in the mode register, thereby determining the next operation. In a case of an example, as shown in FIG. 2, the duty cycle of the externally input data clock signal WCK0 is the upper limit of 57% specified by JEDEC, in the initial step of adjusting the duty cycle, the duty cycle adjustment sub-circuit may increase the duty cycle of the data clock signal WCK0 by 7 steps (the upper limit specified by JEDEC, and each step is 5 picoseconds), that is, 35 picoseconds are increased, which is equivalent to increasing the duty cycle by 15% at a speed of 8533 Mbps. At this time, the duty cycle of the second internal clock signal WCK1 in the memory may be as high as 72%, and the duty cycle of the read clock signal RDQS generated using it may also be as high as 72%. At this time, referring to FIG. 3, which shows a schematic diagram of a waveform of a read clock signal. As shown in FIG. 3, the read clock signal RDQS with the duty cycle of up to 72% is attenuated by a channel during transmission through a circuit module, and may be seriously distorted when reaching the receiving end of the CPU, which makes it difficult to be correctly identified by the CPU, that is, the MRR may obtain wrong data, and eventually causes failure in adjustment of the duty cycle. If the memory speed is higher, this problem may be more serious.

Based on this, the embodiments of the present disclosure provide a control apparatus. The control apparatus is connected with a memory. The control apparatus includes: a receiving circuit, configured to receive a read clock signal from the memory, and output the read clock signal; a clock circuit, configured to generate a first internal clock signal; a selection circuit, configured to receive the read clock signal and the first internal clock signal, and output one of the read clock signal and the first internal clock signal as a target read clock signal; and a latch circuit, configured to receive the target read clock signal and a read data signal sent by the memory, and perform latch processing on the read data signal by using the target read clock signal. In this way, in a case of duty cycle distortion of the clock signal in the memory, the control apparatus may still latch the read data signal through the first internal clock signal, which may not only improve the correctness of data latching, but also save power consumption.

The embodiments of the present disclosure will be described in detail below with reference to the accompanying drawings.

Figure 4:
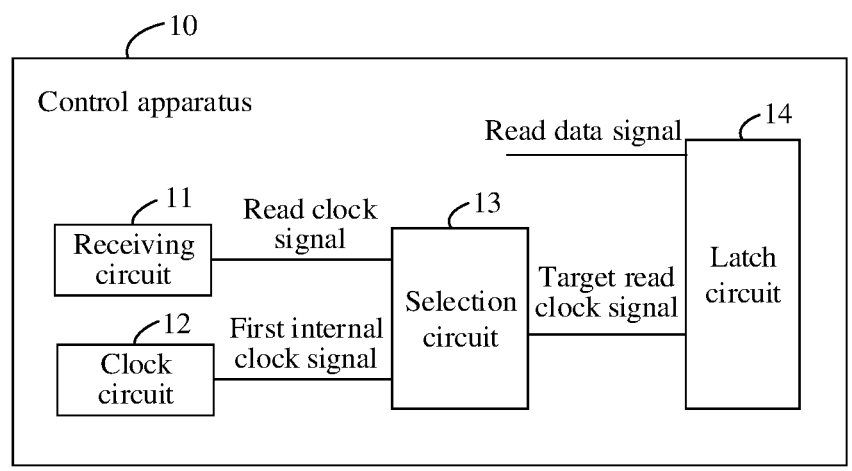
FIG. 4 is a schematic structural diagram of a control apparatus according to an embodiment of the present disclosure.

In an embodiment of the present disclosure, referring to FIG. 4, which shows a schematic structural diagram of a control apparatus 10 according to an embodiment of the present disclosure. As shown in FIG. 4, the control apparatus 10 is connected with a memory, and the control apparatus 10 includes: a receiving circuit 11, a clock circuit 12, a selection circuit 13, and a latch circuit 14.

The receiving circuit 11 is configured to receive a read clock signal from the memory, and output the read clock signal.

The clock circuit 12 is configured to generate a first internal clock signal.

The selection circuit 13 is configured to receive the read clock signal and the first internal clock signal, and output one of the read clock signal and the first internal clock signal as a target read clock signal.

The latch circuit 14 is configured to receive the target read clock signal and a read data signal sent by the memory, and perform latch processing on the read data signal by using the target read clock signal.

It is to be noted that, in the embodiment of the present disclosure, the control apparatus 10 may be a CPU of an electronic device. The memory may be various types of semiconductor memories, such as a DRAM, a SDRAM, a double data rate DRAM, a low power double data rate DRAM, etc.

In different working scenarios, the control apparatus 10 may use the read clock signal obtained from the memory as the target read clock signal, or use the first internal clock signal generated in itself as the target read clock signal, so as to complete the latch processing of the read data signal. In this way, in a case of the duty cycle distortion of the clock signal in the memory, the control apparatus 10 may still latch the read data signal through the first internal clock signal to ensure correct latching of the data.

It is to be noted that, the receiving circuit 11 may be implemented by a signal receiver composed of devices such as an NMOS transistor and a PMOS transistor, the clock circuit 12 may be implemented by a clock generator and a transmission gate, the selection circuit 13 may be implemented by an either-or data selector, and the latch circuit 14 may be implemented by a D-type flip-flop.

Figure 5:
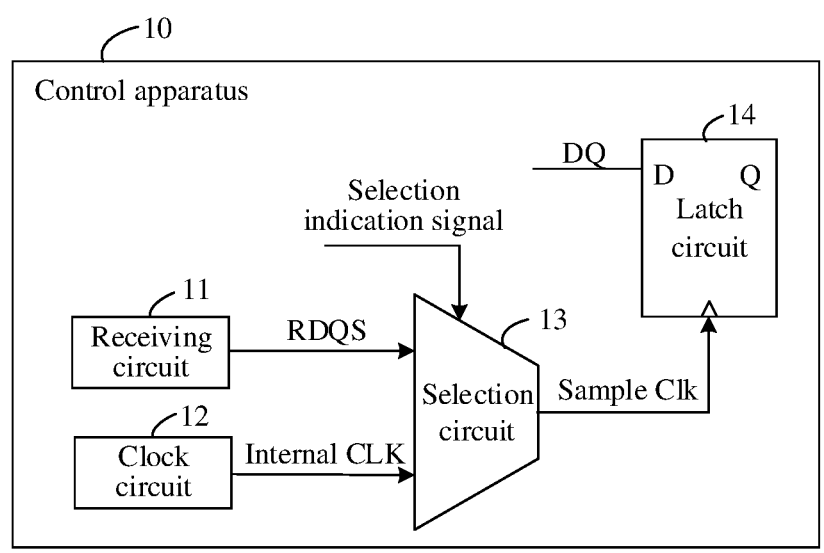
FIG. 5 is a schematic structural diagram of another control apparatus according to an embodiment of the present disclosure.

Referring to FIG. 5, which shows a schematic structural diagram of another control apparatus 10 according to an embodiment of the present disclosure. In FIG. 5, the read clock signal may be represented as RDQS, the first internal clock signal may be represented as Internal CLK, the target read clock signal may be represented as Sample CLK, and the read data signal may be represented as DQ.

In some embodiments, as shown in FIG. 5, the selection circuit 13 is specifically configured to receive a selection indication signal, and output the read clock signal RDQS as the target read clock signal Sample CLK in a case where the selection indication signal is in a first state; or, output the first internal clock signal Internal CLK as the target read clock signal Sample CLK in a case where the selection indication signal is in a second state.

Here, the selection circuit 13 may be an either-or data selector, so as to output the read clock signal RDQS or the first internal clock signal Internal CLK according to the state of the selection indication signal.

In some embodiments, the clock end of the latch circuit 14 is connected with the output end of the selection circuit 13, the input end of the latch circuit 14 receives the read data signal DQ, and the output end of the latch circuit 14 outputs the sampled data signal to be sent to subsequent circuits of the control apparatus for processing.

In some embodiments, the control apparatus 10 is further configured to send a data read instruction to the memory, to enable the memory to generate the read clock signal RDQS and the read data signal DQ.

In some embodiments, the control apparatus 10 is further configured to set the selection indication signal to be in the first state in a case where the data read instruction is the first read instruction; or, set the selection indication signal to be in the second state in a case where the data read instruction is the second read instruction.

It is to be noted that the data read instruction is classified into two types: the first read instruction and the second read instruction. Herein, the second read instruction indicates acquisition of a duty cycle parameter stored in a mode register of the memory, and the first read instruction is a data read instruction other than the second read instruction.

As mentioned above, in a case where the data read instruction is configured to read the duty cycle parameter, the memory may be in the process of adjusting the duty cycle, and in some cases, the clock signal (that is, second internal clock signal WCK1) has been distorted, for example, the duty cycle of the second internal clock signal WCK1 in FIG. 2 may be as high as 72%, and the read clock signal RDQS output by the memory may also be distorted at this time, and the control apparatus 10 may obtain a wrong result by latching the read data signal DQ using the read clock signal RDQS. For the embodiment of the present disclosure, in a case where the data read instruction is configured to read the duty cycle parameter, the first internal clock signal Internal CLK generated by the control apparatus 10 is used as the target read clock signal. Since the first internal clock signal Internal CLK may not be affected by the duty cycle distortion of the second internal clock signal WCK1, the CPU may latch the read data signal using the level change edge of the first internal clock signal Internal CLK, so as to obtain the correct duty cycle parameter.

In addition, in order to save power consumption, in a case where the data read instruction is the second read instruction, the read clock signal RDQS of the memory does not have a practical effect, so that the memory may control the read clock signal RDQS to be in a floating state, and the memory does not need to send the read clock signal RDQS to the control apparatus, so as to save current.

The latching process of the read data signal is described by taking the burst length of the DRAM being 16 and the DRAM having 16 DQ terminals as an example.

For the second read instruction, the first 8 bits of the read data signal DQ carry valid data, represented as DQ<7:0>. According to the provisions of the industry agreement, the parameter value (MR Content) of the mode register is transmitted in the first 8 beats (the first 4 clock cycles) of the target read clock signal RDQS, and the unconcerned data (Valid) is transmitted in the last 8 beats (the last 4 clock cycles).

Figure 6:
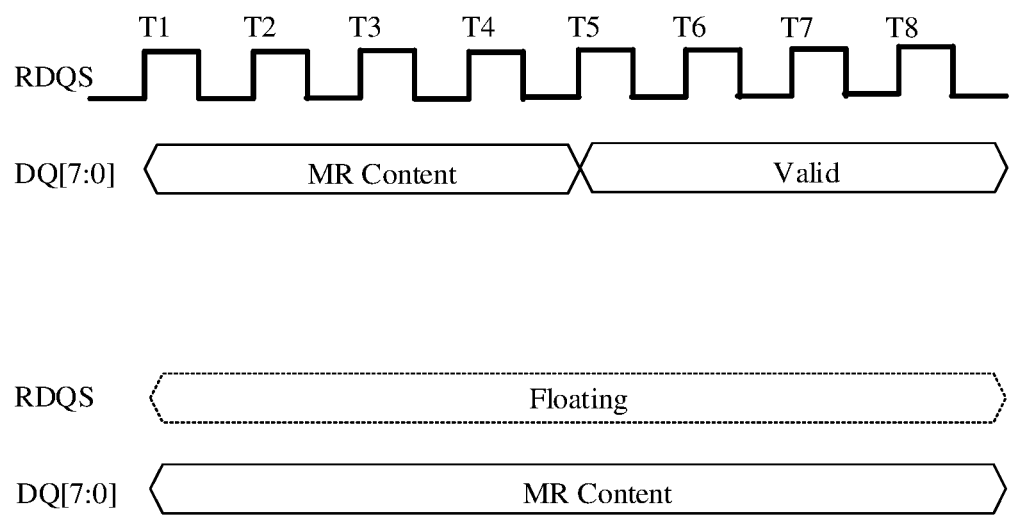
FIG. 6 is a schematic diagram of a signal waveform of data latch processing according to an embodiment of the present disclosure.

That is, as shown in in the upper part of FIG. 6, for the first read instruction, the read data signal DQ<7:0> is latched using the signal edge of the read clock signal RDQS sent by the memory, the data latched in the first 4 clock cycles is MR Content, and the data Valid latched in the last 4 clock cycles is not used. As shown in in the lower part of FIG. 6, for the second read instruction, the read clock signal RDQS is in the floating state, the first internal clock signal Internal CLK of the control apparatus 10 itself is used as the second read clock signal as the target read clock signal RDQS. Since the holding time of the read data signal is long enough, the control apparatus 10 may latch the read data signal DQ<7:0> using the first internal clock signal Internal CLK to obtain the MR Content.

To sum up, the embodiments of the present disclosure provide a control apparatus. The control apparatus is connected with a memory. The control apparatus includes: a receiving circuit, configured to receive a read clock signal from the memory, and output the read clock signal; a clock circuit, configured to generate a first internal clock signal; a selection circuit, configured to receive the read clock signal and the first internal clock signal, and output one of the read clock signal and the first internal clock signal as a target read clock signal; and a latch circuit, configured to receive the target read clock signal and a read data signal sent by the memory, and perform latch processing on the read data signal by using the target read clock signal. In this way, in a case of duty cycle distortion of the clock signal in the memory, the control apparatus may still latch the read data signal through the first internal clock signal, which may not only improve the correctness of data latching, but also save power consumption.

Figure 7:
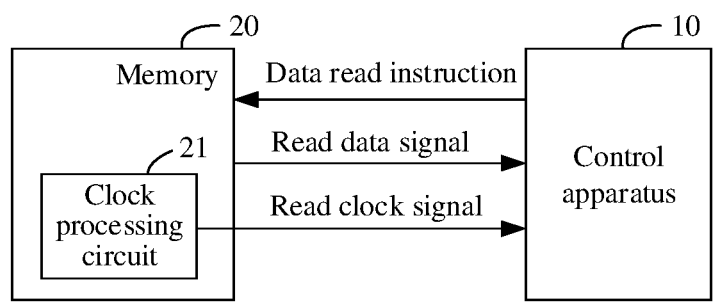
FIG. 7 is a schematic structural diagram of a memory according to an embodiment of the present disclosure.

In another embodiment, referring to FIG. 7, which shows a schematic structural diagram of a memory 20 according to an embodiment of the present disclosure. As shown in FIG. 7, the memory 20 includes a clock processing circuit 21. The memory 20 is connected with a control apparatus 10.

The memory 20 is configured to determine a read data signal DQ based on a first read instruction in a case where the first read instruction is received, and determine a read clock signal RDQS through the clock processing circuit 21, and send the read data signal DQ and the read clock signal RDQS to the control apparatus 10 together; or, in a case where a second read instruction is received, determine the read data signal DQ based on the second read instruction, and send the read data signal DQ to the control apparatus 10.

It should be understood that, in FIG. 7, the first read instruction and the second read instruction are collectively referred to as a data read instruction.

It is to be noted that, in the process of adjusting a duty cycle of the clock signal by the memory 20, the read clock signal RDQS output by the memory 20 may be distorted, thereby causing failure in data latching. In the embodiment of the present disclosure, for the first read instruction, the read clock signal RDQS is normal, the memory 20 provides the read data signal DQ and the normal read clock signal RDQS, and the control apparatus 10 latches the read data signal DQ using the read clock signal RDQS. For the second read instruction, the read clock signal RDQS may be distorted, and the memory 20 may only provide the read data signal DQ, so that the control apparatus 10 latches the read data signal DQ using the first internal clock signal Internal CLK generated by itself, thereby avoiding failure in data latching, and saving current and power consumption.

In some embodiments, the memory 20 is further configured to control the read clock signal RDQS to be in the floating state when the second read instruction is received.

In this way, for the second read instruction, the memory 20 may disable the relevant control module of the read clock signal, that is, the read clock signal is in the floating state, and the memory 20 does not need to send the read clock signal RDQS to the control apparatus 10, thereby saving current and power consumption.

Figure 8:
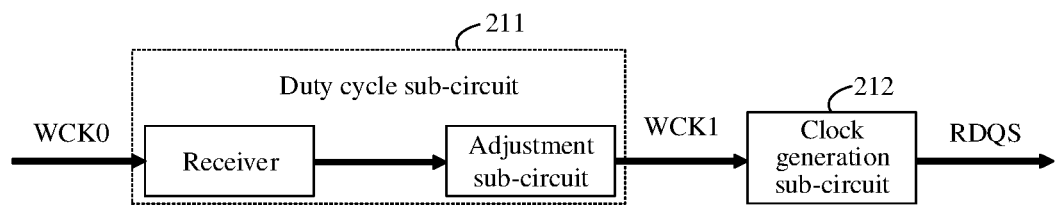
FIG. 8 is a partial schematic structural diagram I of a clock processing circuit according to an embodiment of the present disclosure.

In some embodiments, as shown in FIG. 8, the clock processing circuit 21 includes: a duty cycle sub-circuit 211 and a clock generation sub-circuit 212.

The duty cycle sub-circuit 211 is configured to receive an externally generated data clock signal; and adjust a duty cycle of the data clock signal, and output a second internal clock signal.

The clock generation sub-circuit 212 is configured to receive the second internal clock signal, and output a read clock signal RDQS based on the second internal clock signal. Herein, the read clock signal RDQS is a pulse signal.

In this way, for the first read instruction, the read clock signal RDQS and the read data signal DQ are transmitted to the control apparatus 10 through a hardware circuit, so that the control apparatus 10 obtains the required parameters.

It is to be noted that, the duty cycle sub-circuit 211 includes two parts, and the specific implementation may refer to the subsequent description. The clock generation sub-circuit 212 may be composed of a logic device and a delay unit to achieve delay matching and conform to the standard timing specified by the JEDEC standard.

In some embodiments, the data clock signal WCK0 is a write clock signal (represented as WCK0) received from outside, and the second internal clock signal WCK1 is a write clock signal (represented as WCK1) subjected to duty cycle adjustment in the memory 20.

Figure 9:
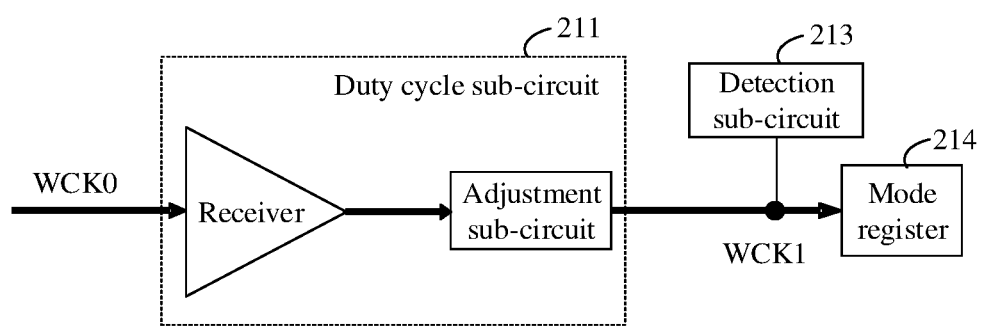
FIG. 9 is a partial schematic structural diagram II of a clock processing circuit according to an embodiment of the present disclosure.

In some embodiments, as shown in FIG. 9, the clock processing circuit 21 further includes: a detection sub-circuit 213 and a mode register 214.

The detection sub-circuit 213 is configured to receive the second internal clock signal WCK1, detect the duty cycle of the second internal clock signal WCK1, and output a duty cycle parameter.

The mode register 214 is configured to receive and store the duty cycle parameter.

Herein, the second read instruction indicates acquisition of the duty cycle parameter stored in the mode register, and the first read instruction is a data read instruction other than the second read instruction.

It is to be noted that the detection sub-circuit 213 may be composed of a logic gate, a transmission gate, a capacitor and a signal comparator.

In some embodiments, the duty cycle sub-circuit 211 includes: a receiver and an adjustment sub-circuit.

The receiver is configured to receive the data clock signal from outside and output the data clock signal WCK0.

The adjustment sub-circuit is configured to adjust the duty cycle of the data clock signal WCK0, and output the second internal clock signal.

It is to be noted that the adjustment sub-circuit is configured to adjust the duty cycle. When the duty cycle adjustment starts, the default setting of the adjustment sub-circuit may cause the duty cycle of the data clock signal WCK0 to increase by a certain value. According to the provisions of the JEDEC, the upper limit of the increase in the duty cycle is 7 steps, that is, 35 picoseconds.

It is to be noted that, the adjustment sub-circuit may be composed of cascaded delay units, and each delay unit is composed of an NMOS transistor and a PMOS transistor, so as to realize the forward/backward adjustment of the rising edge in the data clock signal WCK0, and/or, the forward/backward adjustment of the falling edge in the data clock signal WCK0, thereby adjusting the duty cycle of the data clock signal WCK0 finally.

Figure 10:
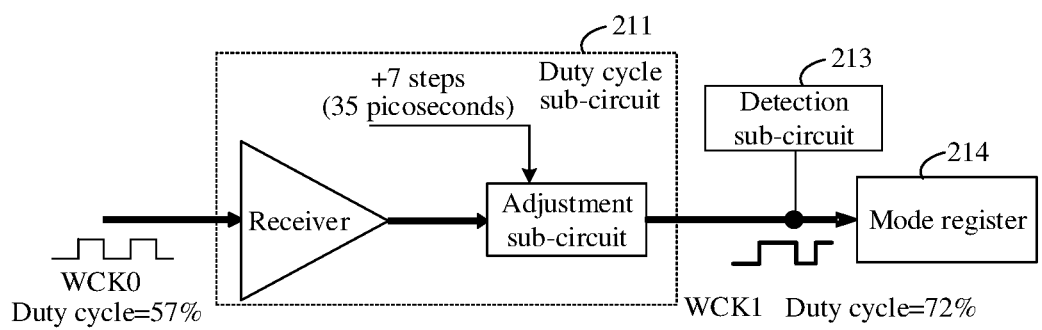
FIG. 10 is a schematic diagram of a working process of a clock processing circuit according to an embodiment of the present disclosure.

A possible working scenario is provided below to illustrate the technical effects of the embodiments of the present disclosure. As shown in FIG. 10, the duty cycle of the externally generated data clock signal WCK0 is 57%. At the beginning of the process of adjusting the duty cycle, the duty cycle of the data clock signal WCK0 is increased by 7 steps (35 picoseconds) by default, if the speed of the memory is 8633 Mbps, the duty cycle of the second internal clock signal WCK1 may continue to increase by 15% on the basis of the data clock signal WCK0, that is, the duty cycle of the second internal clock signal WCK1 may be as high as 72%. In this case, the control apparatus 10 sends the second read instruction to the memory, the memory 20 only needs to send the read data signal DQ to the control apparatus 10, the single memory 20 does not need to generate the read clock signal RDQS using the clock processing circuit 21, and the control apparatus 10 latches the read data signal DQ using the first internal clock signal Internal CLK generated by itself to obtain correct duty cycle parameters and ensure the success of the duty cycle adjustment operation.

The embodiments of the present disclosure provide a memory. The memory includes a clock processing circuit. The memory is connected with a control apparatus. Herein, the memory is configured to, in a case where a first read instruction is received, determine a read data signal based on the first read instruction, determine a read clock signal through the clock processing circuit, and send the read data signal and the read clock signal together to the control apparatus; or, in a case where a second read instruction is received, determine the read data signal based on the second read instruction, and send the read data signal to the control apparatus. In this way, for the second read instruction, the memory does not need to perform additional control on the read clock signal, and does not need to send the read clock signal to the control apparatus, which may not only avoid the adverse effects caused by the duty cycle distortion of the read clock signal, but also save current and power consumption.

Figure 11:
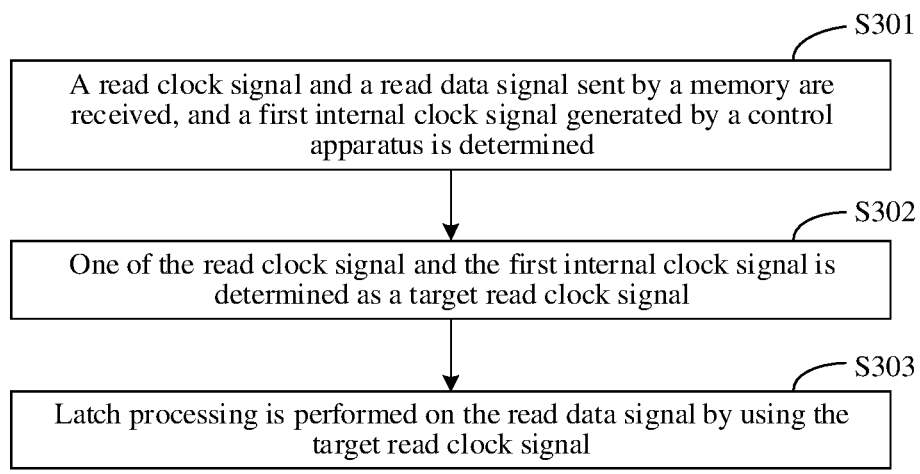
FIG. 11 is a flowchart of a signal processing method according to an embodiment of the present disclosure.

In another embodiment of the present disclosure, referring to FIG. 11, which shows a flowchart of a signal processing method according to an embodiment of the present disclosure. As shown in FIG. 11, the method includes the following operations.

At S301, a read clock signal and a read data signal sent by a memory are received, and a first internal clock signal generated by a control apparatus is determined.

At S302, one of the read clock signal and the first internal clock signal is determined as a target read clock signal.

At S303, latch processing is performed on the read data signal by using the target read clock signal.

It is to be noted that the method is applied to the above control apparatus 10, and the control apparatus 10 is connected to the memory 20. In combination with FIGS. 4 and 5, it may be seen that in different working scenarios, the control apparatus 10 may use the read clock signal RDQS obtained from the memory as the target read clock signal Sample CLK, or use the first internal clock signal Internal CLK generated by itself as the target read clock signal Sample CLK, thereby completing latch processing of the read data signal DQ. In this way, in a case of duty cycle distortion of the clock signal in the memory, the control apparatus 10 may still latch the read data signal DQ through the first internal clock signal Internal CLK to ensure correct latching of the data.

It is to be noted that, in S301, in a case where the first internal clock signal is determined as the target read clock signal, the memory 20 may not send the read clock signal to the control apparatus 10 to save energy. The solution is within the scope of protection of the embodiments of the present disclosure.

In some embodiments, before the read clock signal and the read data signal sent by the memory are received, the method may further include the following operation.

The data read instruction is sent to the memory, to enable the memory to generate the read clock signal and the read data signal.

In some embodiments, the method may further include the following operation.

In a case where the data read instruction is a first read instruction, the read clock signal is determined as the target read clock signal; or, in a case where the data read instruction is a second read instruction, the first internal clock signal is determined as the target read clock signal. Herein, the second read instruction indicates acquisition of a duty cycle parameter stored in a mode register of the memory, and the first read instruction is a data read instruction other than the second read instruction.

That is, in a case where the data read instruction is the first read instruction, the control apparatus 10 receives the read clock signal and the read data signal sent by the memory, and latches the read data signal using the read clock signal. In a case where the data read instruction is the second read instruction, the control apparatus 10 receives the read clock signal sent by the memory, and the control apparatus 10 determines the first internal clock signal generated by itself, and performs latch processing on the read data signal using the first internal clock signal.

The embodiments of the present disclosure provide a signal processing method. The method includes that: a read clock signal sent by a memory is received, and a first internal clock signal generated by a control apparatus is determined; one of the read clock signal and the first internal clock signal is determined as a target read clock signal; and a read data signal sent by the memory is received, and latch processing is performed on the read data signal by using the target read clock signal. In this way, in a case of the duty cycle distortion of the clock signal in the memory, the control apparatus may latch the read data signal through the first internal clock signal, which may not only improve the correctness of data latching, but also save power consumption.

Figure 12:
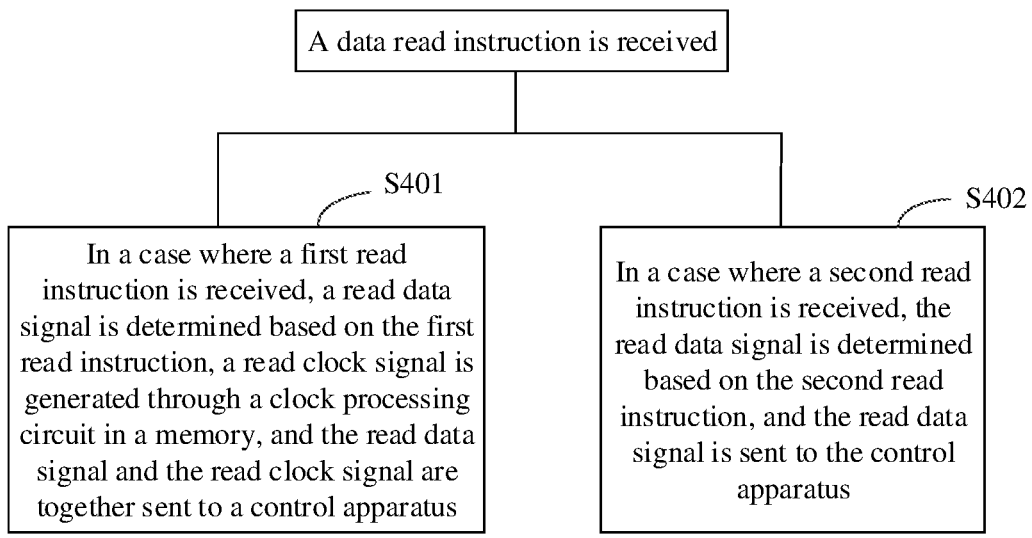
FIG. 12 is a flowchart of another signal processing method according to an embodiment of the present disclosure.

In yet another embodiment of the present disclosure, referring to FIG. 12, which shows a flowchart of another signal processing method according to an embodiment of the present disclosure. As shown in FIG. 12, the method includes the following operations.

At S401, in a case where a first read instruction is received, a read data signal is determined based on the first read instruction, a read clock signal is generated through a clock processing circuit in a memory, and the read data signal and the read clock signal are together sent to a control apparatus.

At S402, in a case where a second read instruction is received, the read data signal is determined based on the second read instruction, and the read data signal is sent to the control apparatus.

It is to be noted that the method is applied to the above memory 20, and the memory 20 is connected with the control apparatus 10. In FIG. 12, the first read instruction and the second read instruction are collectively referred to as a data read instruction. For the memory 20, in a scenario of receiving the first read instruction, the read clock signal RDQS is normal, and the memory 20 provides the read data signal DQ and the read clock signal RDQS, so that the control apparatus 10 latches the read data signal DQ using the read clock signal RDQS. In a scenario of receiving the second read instruction, the read clock signal RDQS may be distorted, and the memory 20 only provides the read data signal DQ, so that the control apparatus 10 latches the read data signal DQ using the first internal clock signal Internal CLK generated by itself to avoid failure in data latching.

In some embodiments, the method further includes that: in a case where the second read instruction is received, the read clock signal is controlled to be in a floating state.

In some embodiments, the operation that a read clock signal is generated through a clock processing circuit in the memory includes the following operations.

An externally generated data clock signal is received; a duty cycle of the data clock signal is adjusted, and a second internal clock signal is output; and the read clock signal is generated based on the second internal clock signal. Herein, the read clock signal is a pulse signal.

In some embodiments, the method further includes that: the duty cycle of the second internal clock signal is detected to obtain a duty cycle parameter; and the duty cycle parameter is stored in a mode register. Herein, the second read instruction indicates acquisition of the duty cycle parameter stored in the mode register, and the first read instruction is a data read instruction other than the second read instruction.

The embodiments of the present disclosure provide a signal processing method. The includes that: in a case where a first read instruction is received, a read data signal is determined based on the first read instruction, a read clock signal is generated through a clock processing circuit in the memory, and the read data signal and the read clock signal are together sent to the control apparatus; or, in a case where a second read instruction is received, the read data signal is determined based on the second read instruction, and the read data signal is sent to the control apparatus. In this way, for the second read instruction, the memory does not need to generate the read clock signal, which may not only avoid the adverse effects caused by the duty cycle distortion of the read clock signal, but also save current and power consumption.

Figure 13:
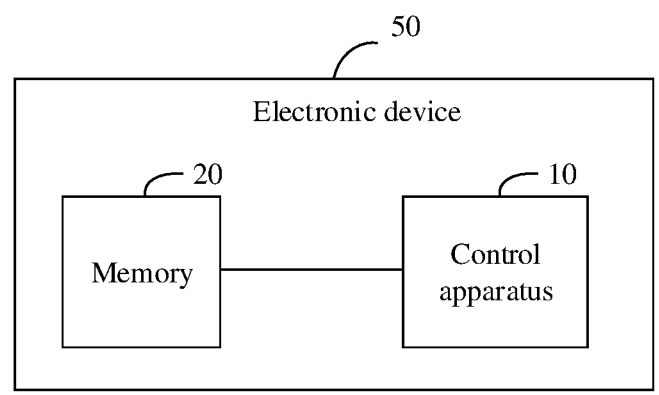
FIG. 13 is a schematic structural diagram of an electronic device according to an embodiment of the present disclosure.

In still another embodiment of the present disclosure, referring to FIG. 13, which shows a schematic structural diagram of compositions of an electronic device 50 according to an embodiment of the present disclosure. As shown in FIG. 13, the electronic device 50 includes at least the above control apparatus 10 and the above memory 20.

In different working scenarios, the control apparatus 10 may use the read clock signal obtained from the memory 20 as the target read clock signal, or use the first internal clock signal generated by itself as the target read clock signal, thereby completing latch processing of the read data signal DQ. In this way, in a case of the duty cycle distortion of the clock signal in the memory, the control apparatus 10 may still latch the read data signal through the first internal clock signal, which may not only improve the correctness of data latching, but also save power consumption.

The above are only the preferred embodiments of the present disclosure, and are not intended to limit the scope of protection of the present disclosure. It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

The embodiments of the present disclosure provide a control apparatus, a memory, a signal processing method, and an electronic apparatus. The control apparatus is connected with the memory. The control apparatus includes: a receiving circuit, configured to receive a read clock signal from the memory, and output the read clock signal; a clock circuit, configured to generate a first internal clock signal; a selection circuit, configured to receive the read clock signal and the first internal clock signal, and output one of the read clock signal and the first internal clock signal as a target read clock signal; and a latch circuit, configured to receive the target read clock signal and a read data signal sent by the memory, and perform latch processing on the read data signal by using the target read clock signal. In this way, in a case of duty cycle distortion of the clock signal in the memory, the control apparatus may still latch the read data signal through the first internal clock signal, which may not only improve the correctness of data latching, but also save power consumption.

What is claimed is:

1. A memory, comprising
a clock processing circuit and connected with a control apparatus,
wherein the memory is configured to, in a case where a first read instruction is received, determine a read data signal based on the first read instruction, determine a read clock signal through the clock processing circuit, and send the read data signal and the read clock signal together to the control apparatus; or,
in a case where a second read instruction is received, determine the read data signal based on the second read instruction, and send the read data signal to the control apparatus;
wherein the memory is further configured to control the read clock signal to be in a floating state in a case where the second read instruction is received.

2. The memory of claim 1, wherein the clock processing circuit comprises:
a duty cycle sub-circuit, configured to receive an externally generated data clock signal; and adjust a duty cycle of the data clock signal, and output a second internal clock signal; and
a clock generation sub-circuit, configured to receive the second internal clock signal, and output the read clock signal based on the second internal clock signal, wherein the read clock signal is a pulse signal.

3. The memory of claim 2, wherein the clock processing circuit further comprises:
a detection sub-circuit, configured to receive the second internal clock signal, detect the duty cycle of the second internal clock signal, and output a duty cycle parameter; and
a mode register, configured to receive and store the duty cycle parameter; wherein the second read instruction indicates acquisition of the duty cycle parameter stored in the mode register, and the first read instruction is a data read instruction other than the second read instruction.

4. The memory of claim 2, wherein the duty cycle sub-circuit comprises:
   a receiver, configured to receive the data clock signal from outside and output the data clock signal; and
   an adjustment sub-circuit, configured to adjust the duty cycle of the data clock signal, and output the second internal clock signal.

5. The memory of claim 2, wherein the data clock signal is a write clock signal.

6. A signal processing method, applied to a memory connected with a control apparatus, the method comprising:
   in a case where a first read instruction is received, determining a read data signal based on the first read instruction, generating a read clock signal through a clock processing circuit in the memory, and sending the read data signal and the read clock signal together to the control apparatus;
or,
   in a case where a second read instruction is received, determining the read data signal based on the second read instruction, and sending the read data signal to the control apparatus;
   the signal processing method further comprising:
   controlling the read clock signal to be in a floating state in a case where the second read instruction is received.

7. The signal processing method of claim 6, wherein
   the generating a read clock signal through a clock processing circuit in the memory comprises:
   receiving an externally generated data clock signal;
   adjusting a duty cycle of the data clock signal, and outputting a second internal clock signal; and
      generating the read clock signal based on the second internal clock signal, wherein the read clock signal is a pulse signal.

8. The signal processing method of claim 7, further comprising:
   detecting the duty cycle of the second internal clock signal to obtain a duty cycle parameter; and
   storing the duty cycle parameter in a mode register;
   wherein the second read instruction indicates acquisition of the duty cycle parameter stored in the mode register, and the first read instruction is a data read instruction other than the second read instruction.

9. The memory of claim 3, for the second read instruction, the read data signal carry a valid data, and the valid data is the parameter value of the mode register.

10. The memory of claim 8, for the second read instruction, the read data signal carry a valid data, and the valid data is the parameter value of the mode register.

* * * * *